United States Patent [19]
Davies

[11] Patent Number: 5,378,998
[45] Date of Patent: Jan. 3, 1995

[54] CURRENT MEASUREMENT CIRCUITS

[75] Inventor: Andrew C. Davies, Cheltenham, England

[73] Assignee: Smiths Industries Public Limited Company, London, England

[21] Appl. No.: 143,900

[22] Filed: Nov. 2, 1993

[30] Foreign Application Priority Data

Nov. 5, 1992 [GB] United Kingdom ............... 9223219

[51] Int. Cl.6 .............................................. G01R 1/30
[52] U.S. Cl. ................................. 330/288; 324/123 R
[58] Field of Search ................ 323/315, 316; 330/288; 324/123 R, 120

[56] References Cited

U.S. PATENT DOCUMENTS

| 4,827,207 | 5/1989 | Chieli | 323/316 |
| 4,910,455 | 3/1990 | Nadd | 324/123 R |
| 5,084,633 | 1/1992 | Izadinia | 307/270 |

FOREIGN PATENT DOCUMENTS

| 213078 | 8/1984 | German Dem. Rep. . | |
| 267574 | 5/1989 | German Dem. Rep. . | |
| 0119812 | 5/1991 | Japan | 330/288 |
| 1115202 | 5/1968 | United Kingdom . | |

Primary Examiner—Steven Mottola
Attorney, Agent, or Firm—Pollock, VandeSande & Priddy

[57] ABSTRACT

A circuit for measuring current flowing along a line including a resistance has two transistors with their emitters connected to the line on opposite sides of the resistance and with their collectors connected to a zero voltage rail via respective resistors. The bases of the transistors are connected together so that one transistor controls current flow through the second. The voltage across the resistor connected to the second transistor is representative of current flow in the line.

5 Claims, 2 Drawing Sheets

CURRENT MEASUREMENT CIRCUITS

BACKGROUND OF THE INVENTION

This invention relates to current measurement circuits.

The usual way of measuring current is by means of a shunt resistor, which converts the line current into a measurable voltage drop. This arrangement has the disadvantage that complex electronic circuitry is necessary to extract the small voltage drop across the shunt resistor when this is superimposed on a much higher line voltage.

BRIEF SUMMARY OF THE INVENTION

It is an object of the present invention to provide an improved circuit for measuring current.

According to one aspect of the present invention there is provided a circuit for measuring current flowing along a first line including resistance means for introducing a voltage drop in the line, a first element coupled to the first line on one side of the resistance means so that a first current flows through the first element, a second element coupled to the first line on the opposite side of the resistance means so that a second current flows through the second element, the first element being connected to the second element such that it controls the second current flowing through the second element, and the circuit including means for deriving an output from the second current that is indicative of current flow along the first line.

The first and second elements preferably include a transistor. The transistors preferably have their bases connected together. The transistors may be connected between the first line and a zero voltage rail and are preferably connected to the zero voltage rail via respective resistors. The resistors may be of different values. The output may be derived from the voltage across one of the resistors connected between a transistor and the zero voltage rail. The output voltage may be applied to the base of a third transistor.

Two circuits for measuring current, in accordance with the present invention, will now be described, by way of example, with reference to the accompanying drawings.

DETAILED DESCRIPTION OF THE PREFERRED EMBODIMENTS

Figure 1:
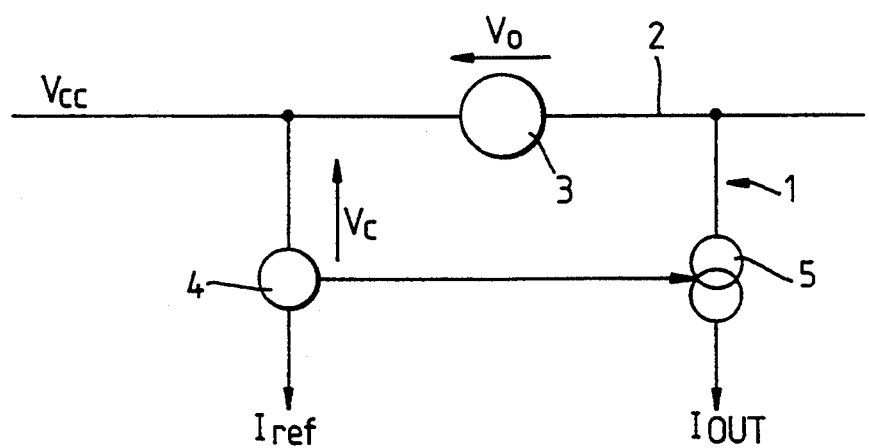
FIG. 1 is a schematic diagram of one form of circuit.

With reference first to FIG. 1, the circuit 1 is connected in an electrical conductor or line 2 along which current Im flows. The circuit includes some means 3, such as a shunt resistor, for producing a voltage drop along the line 2, and two elements 4 and 5 connected to the line on opposite sides of the voltage drop means. The current flowing through the first element 4 is a reference current Iref, the first element producing an intermediate control voltage Vc which is applied to the second element 5. Current flow through the second element 5 is designated Iout and is controlled by the control voltage Vc. Without the voltage drop means 3, the output current Iout would be equal to the reference current Iref flowing through the first element 4. The voltage drop means 3, however, introduces an offset voltage Vo into the line 2 so that the output current is varied as a result of the modulation of the effective control voltage Vc.

Figure 2:
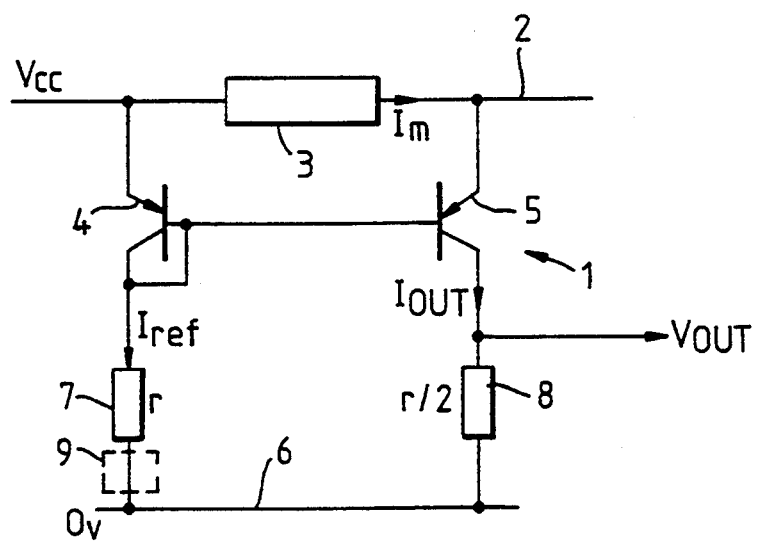
FIG. 2 shows the circuit of FIG. 1 in greater detail.

FIG. 2 shows the same circuit as FIG. 1 but in detail, showing that the voltage drop means 3 is a resistor and the two elements 4 and 5 are PNP bipolar transistors. The transistors 4 and 5 have their emitters connected to the line 2 and their bases connected to one another. The collectors of the two transistors 4 and 5 are connected to a 0 volts rail 6 via respective resistors 7 and 8. The resistor 7 connected to the first transistor 4 has a value r, whereas the resistor 8 connected to the second transistor 5 has half this value, that is, r/2. The voltage Vout across the resistor 8 provides the output voltage of the circuit 1 from which the current Im flowing in line 2 can be calculated. The reference current Iref causes a voltage drop across the emitter resistance of the first transistor 4, which is transferred via the base voltage to the second resistor 8. Without the voltage drop caused by current flowing through the resistor 3, the current Iout produced by the second transistor 5 would be equal in magnitude to the reference current Iref. The voltage drop across the resistor 3, however, causes a modulation of the effective emitter voltage within the second transistor 5 and hence varies the output current Iout. This in turn varies the output voltage Vout which is referenced to ground and not to the voltage Vcc of the line 2.

The current Im flowing along line 2 in the direction of the arrow shown in FIG. 2 results in a decrease in the output voltage Vout; a current flowing in the opposite direction would increase Vout.

In the circuit shown in FIG. 2, the reference current Iref, and hence the output voltage Vout, are proportional to the voltage Vcc on line 2. This dependence can be removed by including some conventional means 9 for producing a reference current of constant magnitude.

The circuit shown in FIG. 2 may also suffer from problems because the temperature dependency of the transistor emitter resistance may cause gain variations with temperature.

Figure 3:
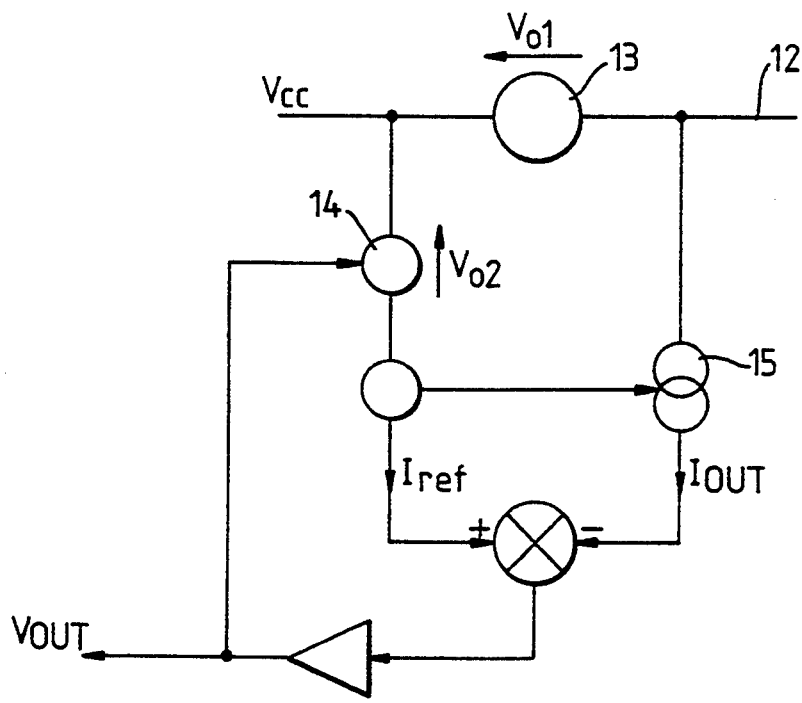
FIG. 3 is a schematic diagram of an alternative circuit.
Figure 4:
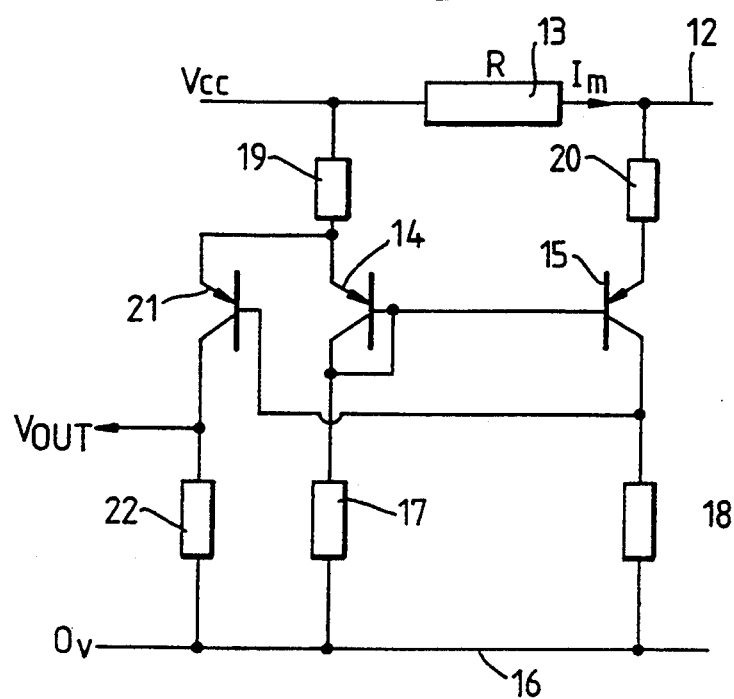
FIG. 4 shows the circuit of FIG. 3 in greater detail.

With reference now to FIGS. 3 and 4 there is shown an alternative circuit by which these variations can be reduced. Both FIGS. 3 and 4 relate to the same circuit, with FIG. 3 showing operation of the circuit more schematically and FIG. 4 showing the circuit in detail. Those components in the circuit of FIGS. 3 and 4 that are the same as the components in FIGS. 1 and 2 are given the same reference numeral but increased by 10.

This circuit introduces a second offset voltage Vo2 to match the offset voltage Vo1 dropped across the shunt resistor 13. Two resistors 19 and 20, which are equal in magnitude, are connected between the current line 12 and respective ones of the transistors 14 and 15. The resistors 17 and 18, connected between the collectors of the transistors 14 and 15 and the 0 volts rail 16, are of equal value, the output voltage across the resistor 18 being supplied to the base of a third transistor 21. The third transistor 21 has its emitter connected to the emitter of the first transistor 14 and its collector connected to the 0 volts line 16 via a resistor 22. The output voltage Vout from this circuit is taken across the resistor 22.

When a current Im flows in line 12, in the direction of the arrow, it unbalances the current mirror produced by the two transistors 14 and 15. This unbalance causes the third transistor 21 to be forward biased so that a current Iout flows in this transistor. The current Iout increases the voltage drop across the resistor 19 until the emitters of the two transistors 14 and 15 are returned to the same voltage. As Vo2 is equal to Vo1, it follows that:

$$Iout \times R1 = Im \times R$$

where R1 is the resistance of resistor 19, and
R is the resistance of resistor 13.

It can be seen, therefore, that the magnitude of the current Im can be determined directly from Iout or Vout. Both Iout and Vout are independent of current flowing through the transistors 14 and 15 and are thereby independent of the voltage Vcc on line 12. The offset voltage Vo2 has the effect of maintaining Iout equal in magnitude to Iref so that gain variations and non-linearities do not affect the output of the circuit.

The invention described above enables the large common mode signal element, that is the line voltage, to be removed and the voltage drop across the shunt resistor to be measured by means of a relatively simple circuit.

What I claim is:

1. A circuit for measuring current flowing along a line including a resistance that introduces a voltage drop in the line, wherein the circuit comprises: a first element that includes a first transistor; means coupling the first element to the line on one side of said resistance so that a first current flows through the first element; a second element that includes a second transistor; means coupling the second element to the line on the opposite side of said resistance so that a second current flows through the second element; a zero voltage rail; two resistors; means connecting said first and second transistors to said zero voltage rail via respective ones of said two resistors; means coupling the base of said first transistor to the base of said second transistor such that the first element controls the second current flowing through the second element; and means for deriving an output from the second current that is indicative of current flow along the line.

2. A circuit according to claim 1, wherein the two resistors are of different values.

3. A circuit according to claim 1, including means deriving said output from the voltage across said one of two resistors.

4. A circuit according to claim 3, including a third transistor and means connecting said voltage to a base of the third transistor.

5. A circuit for measuring current flowing along a first line including a resistance that introduces a voltage drop in the line, wherein the circuit comprises: a zero voltage rail; a first transistor; means coupling the first transistor to the first line on one side of the resistance so that a first current flows through the first transistor; a second transistor; means coupling the second transistor to the first line on the opposite side of the resistance so that a second current flows through the second transistor; means coupling the base of the first transistor to the base of the second transistor such that the first transistor controls the second current flowing through the second transistor; a first resistor; means coupling the first resistor between the first transistor and the zero voltage rail; a second resistor; means coupling the second resistor between the second transistor and the zero voltage rail; and means for deriving an output from the voltage across the second resistor that is indicative of current flow along the first line.

* * * * *